United States Patent [19]

Wilheim et al.

[11] Patent Number: 4,753,847

[45] Date of Patent: Jun. 28, 1988

[54] MOLD RELEASE SHEET LAMINATE

[75] Inventors: Martin J. Wilheim, 17 Woodbine Ave., Larchmont, N.Y. 10538; Edwin P. Tripp, III, Wilmington, Mass.

[73] Assignee: Martin J. Wilheim, Larchmont, N.Y.

[21] Appl. No.: 854,962

[22] Filed: Apr. 23, 1986

Related U.S. Application Data

[63] Continuation-in-part of Ser. No. 656,207, Oct. 1, 1984, abandoned, which is a continuation-in-part of Ser. No. 559,801, Dec. 9, 1983, abandoned.

[51] Int. Cl.⁴ .......................... B32B 9/04; B32B 9/06; B32B 27/08; B32B 27/10
[52] U.S. Cl. .............................. 428/411.1; 428/473.5; 428/475.5; 428/476.1; 428/479.6; 428/480; 428/481; 428/483; 428/523; 428/535; 428/901
[58] Field of Search ............... 428/480, 202, 172, 352, 428/530, 40, 63, 217, 901, 481, 483, 411.1, 473.5, 475.5, 476.1, 479.6, 523; 156/247, 219, 288, 289; 100/295

[56] References Cited

U.S. PATENT DOCUMENTS

| | | | |
|---|---|---|---|
| 3,507,733 | 4/1970 | Davidson | 156/247 |
| 3,700,537 | 10/1972 | Scher | 428/172 |
| 3,932,250 | 1/1976 | Sato et al. | 156/288 X |
| 3,969,174 | 7/1976 | Kelly et al. | 156/219 |
| 4,166,150 | 8/1979 | Mattor et al. | 428/530 |
| 4,243,461 | 1/1981 | Jaislè et al. | 156/288 |
| 4,263,073 | 4/1981 | Jaisle et al. | 156/288 X |
| 4,421,816 | 12/1983 | Arnold | 428/202 |
| 4,461,800 | 7/1984 | Tanaka | 428/217 |

FOREIGN PATENT DOCUMENTS

WO85/03669  8/1985  PCT Int'l Appl. .............. 100/295

*Primary Examiner*—Thomas J. Herbert
*Attorney, Agent, or Firm*—Pennie & Edmonds

[57] ABSTRACT

A mold release sheet structure in medium to high pressure laminate wherein the laminate comprises a film of polyester, nylon or cellulose acetate treated for promoting resin adhesion and having a coating of a thin release layer of a cured release acrylated oligomer resin on at least one side of the film.

17 Claims, 7 Drawing Sheets

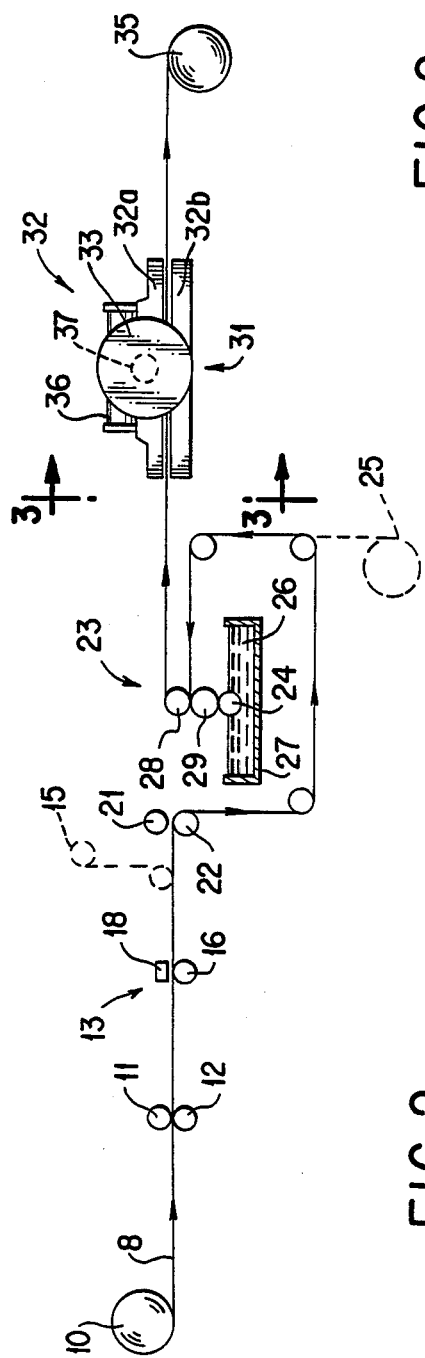
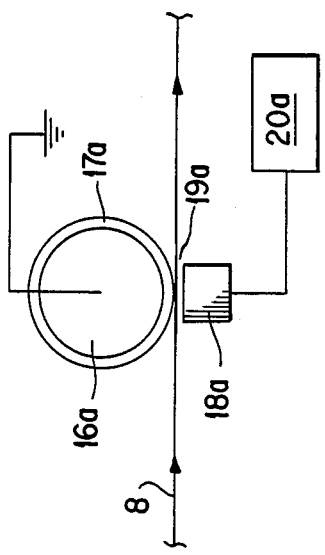
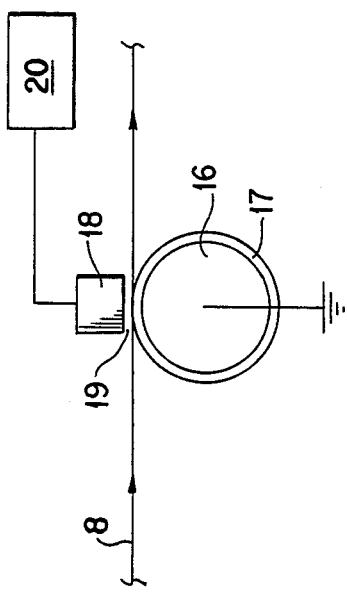

FIG. 10
STEP 2    CT + RL + Cure
                    POLYESTER FILM
STEP 1    CT + AL + Cure + Lam
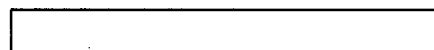                    PAPER
FIG. 10A
STEP 3    CT + RL + Cure
                    POLYESTER FILM
STEP 1    CT + RL + Cure + Lam
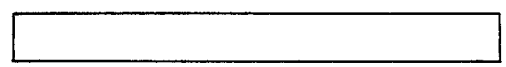                    PAPER
STEP 2A   CT + AL + Cure + Lam
                    POLYESTER FILM
STEP 3    CT + RL + Cure + Lam

MOLD RELEASE SHEET LAMINATE

RELATIONSHIP WITH OTHER APPLICATIONS

This application is a continuation-in-part of our pending application Ser. No. 656,207 filed Oct. 1, 1984, now abandoned, which in turn was a continuation-in-part of application Ser. No. 559,801 filed Dec. 9, 1983, entitled "Mold Release Sheet And Method of Manufacture", now abandoned.

BACKGROUND OF THE INVENTION

Numerous mold release sheets have been proposed for facilitating the release of the molded laminated structures from the molds in which they are formed. Such release sheets have included single layer sheets, multilayer sheets and coated sheets. For example, a polypropylene layer on kraft paper or cellophane has been suggested for making floor and wall coverings (U.S. Pat. No. 3,507,733); and aluminum foil kraft paper composites have been disclosed for making embossed laminates (U.S. Pat. No. 3,700,537).

Thermoplastic materials such as Surlyn ionomer resin; Tedlar polyvinyl fluoride material and Mylar polyester material, all du Pont products, have been used or suggested for possible use as release sheets under specific molding conditions (U.S. Pat. No. 3,969,174).

Release sheets with cured coating have also been disclosed (U.S. Pat. No. 4,166,150) and various methods of preparing release sheets published (U.S. Pat. No. 4,243,461; and U.S. Pat. No. 4,263,073).

Mold release sheets have also been proposed for the processing and production of epoxy laminates and multilayered circuit board laminates. For example, the above-mentioned Tedlar product has been used as a release sheet for epoxy multilayered circuit boards.

SUMMARY OF THE INVENTION

Broadly, the present invention is a mold release sheet structure used in medium and high pressure laminate molding comprising a polyester, nylon or cellulose acetate film and a layer or coating of release resin material on at least one side of the film. Preferably, both sides of the film are coated to form a three (3) layered sheet structure. The film is first chemically, mechanically or electrically (corona discharge) treated on one or more sides to improve adhesion of the coated release material which material has the characteristic of readily releasing from (1) the surface of the laminated structures including clad and unclad surfaces; (2) the metal molding equipment and (3) any other mold-assisting sheet or layer used in the molding operation. Laminated structures include laminate components which components are used to, in turn, fabricate multilayer laminates such as printed circuit boards and other laminates. The invention is also directed to the method of manufacture of the release sheet structure.

It is a feature of this invention that the polyester, nylon or cellulose acetate films used as a substrate are thermally stable, coatable, have high service temperature, good dimensional stability, high tensile strength and smooth level surfaces. In addition, such films have good lay-flat characteristics and are readily available at reasonable prices.

It is a further feature of the invention that the release coatings can be applied to the film in textured patterns which patterns in turn serve to produce a mirror pattern on the unclad surfaces of laminate components. Textured patterned surfaces assist in bonding between laminate components in multilayer fabrications.

BRIEF DESCRIPTION OF THE DRAWINGS

FIG. 1 is a schematic elevational view showing the manufacturing process of the mold release sheet structure including the corona and electron beam stations;

FIG. 2 is an elevational view of the corona treatment station;

FIG. 2a is an elevational view of a second corona treatment station;

FIGS. 5a, 6, 7, 7A, 8, 8A, 9, 9A, 10 and 10A are laminate constructions in accordance with the invention.

DESCRIPTION OF THE PREFERRED EMBODIMENT

Figure 3:
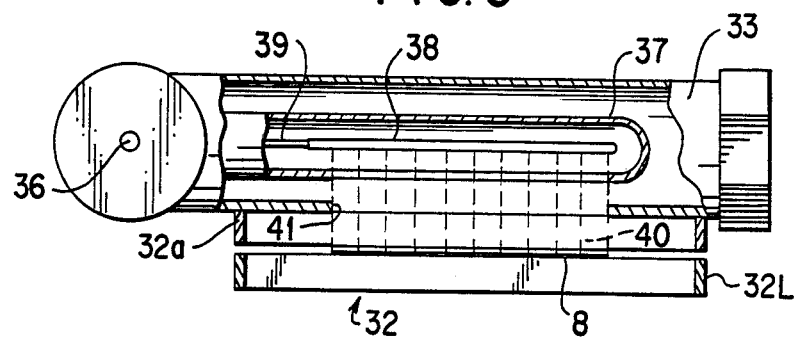
FIG. 3 is a sectional view of the electron beam station along line 3—3 of FIG. 1.

Turning to FIG. 1, a polyester film 8 (such as ICI America's Melinex 442, Melinex S, or equivalent) having a thickness in the range of 0.005 inches to 0.0005 inches and preferably about 0.00092 inches (and having any selected width which is suitable for handling by the process equipment used) is fed from feed roll 10 through drive rolls 11, 12 to corona treatment station 13. Melinex is a polyester material formed of polyethylene terephthalate. Polyester films are hydrophobic. Other polyester films found useful are those sold by ICI 92 gauge Type S and Consolidated Thermoplastic Product #330 having an 0.010 inch gauge. Alternatively, nylon films having the coating receptivity and heat resistance as required may also be used. In particular any film made of Type 66 polymer has been found useful. Type 66 polymers comprise polymers which are the condensation product of adipic acid and hexamethylene diamine. The film also includes an addition agent to provide for high heat resistance. The polymer has a specific gravity of about 1.13. Such nylon films (which are preferably of the thickness of about 1 mil to about 4 mil) have a melting temperature of about 510 TM F. In addition, film 8 may be a cellulose acetate film, and particularly a triacetate cellulose film HP-550 AA produced by Courtaulds C.P.D. Inc. Other useful films for functioning as carriers of the release coating include polyethersulphone film; manufactured by ICI as "Stabar S"; polyetherimide film manufactured by General Electric under "Ultem"; and polyimide films, such as KAPTON, manufactured by E. I. du Pont de Nemours & Co.

Corona treatment station 13 (such as Deerpark Industries DP-9018 Treat Station with an ENI Model RS-96 Power Supply) includes roller electrode 16 (See FIG. 2) covered with dielectric insulating cover 17 and linear electrode 18. The air gap 19 between linear electrode 18 and cover 17 is about 0.040–0.080 inches. A high frequency and high voltage power source 20 causes corona discharges to pass from the linear electrode 18 to the roller electrode 16 as film 8 passes through air gap 19 thus treating the film surface to a dyne level in the order of 72 which treatment makes the film surface more receptive to the release coating to be later applied. Treated film 8 may be diverted to take up intermediate roll 15 or fed to the subsequent stations as further described. Alternatively, the film may be treated by other means such as chemical, mechanical or other treatment means to promote satisfactory adhesion.

The purpose of the corona or other film surface treatment is to promote adhesion of the coating to the film and to improve the wetability of the surface.

Referring again to FIG. 1, second feed roller pair 21, 22 carry film 8 next to coating station 23 where engraved gravure roll 24 picks up a release coating such as Mobil Chemical No. 82XE087 or Inmont Corporation Chemical No. NBE 1102, both curable acrylated resins, from coating bath 26 in reservoir tank 27. The Mobil product is an acrylated oligomer or resin which may include an acrylated epoxy or acrylated urethane. These coating resins may be diluted with acrylate monomers to reduce viscosity or other monomers such as N-vinyl pyrrolidone. Valspar 83XE007C may also be used as a release coating. The coating may also include flatting agents, release additives, clays, and pigments. Gravure cylinder roller 24 then transfers the coating to rubber transfer roller 29 which in turn transfers the coating to the topside of film 8. Gravure cylinder 24 has numerous etched cells in its surface which deposit a uniform and predetermined amount of coating. This amount of coating can be changed by using different gravure cylinders and will affect the surface topography of the coated substrate. Back up roll 28 is also shown. Gravure rollers having differing numbers of cells per area may be used to obtain the desired pattern. Besides offset gravure, other coating techniques for coating film 8 may also be used, including the direct gravure method; the Meyer rod method, or use of multiple smooth rolls where the amount of coating is determined by setting a gap between two coating rolls. Preferably the application provides a thin coating requiring only about 1.5 to about only 6 (preferably 3 to 4) pounds of coating per three thousand (3000) square feet of surface.

Next, coated film 8 enters electron beam curing station 31 where the coating is cured. Station 31 includes film passage assembly 32, with upper and lower sections 32a, 32b, electron accelerator housing 33, and power supply 36. Turning to FIG. 3, it is seen that electron accelerator housing 33 carries in it a tubular beam control assembly 37 which in turn contains a linear electron beam element 38 mounted on extension arm 39. Electron beam element 38 discharges downwardly a curtain (strip) of electrons (depicted by a plurality of lines 40) through window 41 in upper section 32a. Alternatively, a point (or "pencil") type cathode scanner equipment may be used which projects a beam of electrons which can be scanned or swept over the coated film. The bombardment of the coated film by electrons initiates a polymerization reaction in the coating and forms a dry, tack-free product. Curing doses typically in the range of 1.5 to 3.0 megarads have been found satisfactory for curing the coatings as applied to the moving film 8. As cured, the film surface coating has a distinct textured pattern which pattern can serve to form or impress a reverse pattern in the surface of an adjacent laminate of a molded product.

The film, as cured, is wound on take up roll 35. Preferably, film 8 is then processed a second time to treat and coat the opposite side; however, since a second pass through the corona station can result in degrading the release properties of the first-pass coating, the following procedure can be followed.

1. First, the film is passed through the corona station to only treat side one of the film;
2. The film is turned over and passed through the corona station to treat the second side and in a continuous manner is coated and cured to provide a cured coat on the second side;
3. The film is again turned over, mounted on feed roll 25 (FIG. 1), and passed through coating and curing stations (but not corona treatment) to provide a cured coating on the first side.

Alternatively, corona treatment can be accomplished by employing an additional corona station 13a (FIG. 2a) to accomplish treating both sides of sheet 8 in one pass. Station 13a, when used, is preferably inserted in the process shown in FIG. 1 immediately before or immediately following corona station 13. Station 13a is identical to station 13 except it is inverted to treat the bottom side of film 8.

The present invention is directed to the production of the laminate components and also to the fabrication of multilayer laminate products. Laminate components are used to construct multilayer laminates comprising one or more laminate components. Laminate components may include one side clad, two sides clad, or no side clad. Prepreg sheets are used both in manufacture of laminate components and to affix one laminate component to another in multilayer fabrication.

Advantages of the release sheet structure for use in manufacture of laminate components (like FR-4 type laminates) used in the circuit board and other industries include the release sheet structure's (1) ability to withstand molding temperatures between 340 TM -370 TM F. for 30-60 minutes (or longer) at pressures of 400-1000 psi without softening, shrinking, embrittling or discharging of gas odor; (2) substantially inert properties which prevent adverse affects on the chemical, electrical or physical properties of adjacent laminates; (3) translucency which is desirable for quality control inspection of a product pressed against it; (4) strength that enables it to be readily stripped after completion of the molding operation; (5) excellent releasing properties from adjacent surfaces including epoxy resins even when subjected to variable molding conditions including extreme heat, pressure, and time; and (6) ability to impart a matte finish, texture, or controlled gloss to the unclad surface of laminate components.

The use of the present release sheet structure in multilayer manufacture has the following additional advantages. The release sheet structure:

(i) does not stick to the clad, the prepreg sheet, the kraft sheet nor the laminate surfaces;
(ii) assists in preventing migration of flowable material from one laminate component to another;
(iii) does not shrink;
(iv) is resistant to embrittlement;
(v) has good tensile strength;
(vi) has sufficient rigidity to assist in handling;
(vii) does not emit excessive odors;
(viii) minimizes the static electric charges, thus easing removal from the mold; and
(ix) has good hole-forming characteristics whether drilled or punched.

The texture on the surface of the release sheet structure is caused by the amount of coating deposited, the rheology of the coating and the way the coating transfers to the film substrate. The release sheet structure of the present invention also improves the unclad surface of epoxy-glass laminate components by reducing the height of glass protrusions (or "knuckles") above the surface of the laminate. This action of the release sheet structure causes the rough epoxy-glass surface to exhibit a more resin-rich characteristic in that the surface functions as if it had increased the epoxy resin and lessened the glass at the surface.

Figure 4:
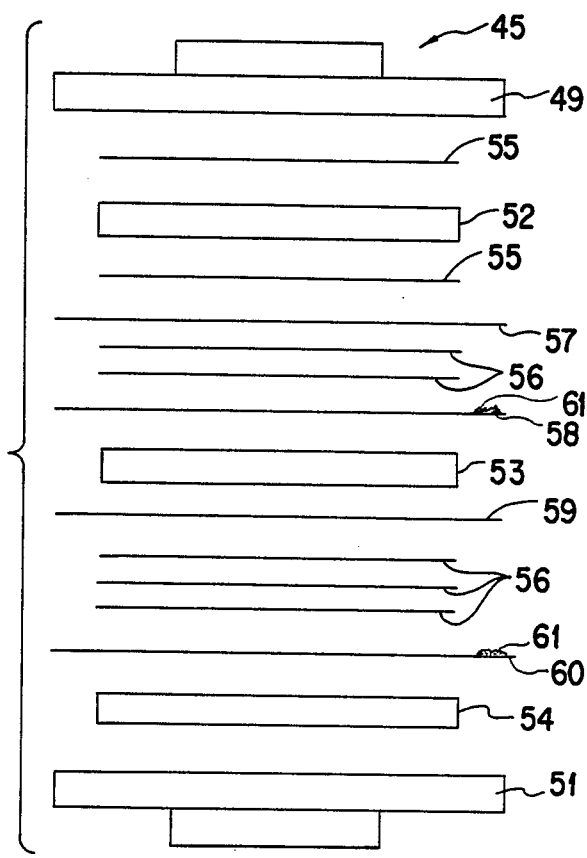
FIG. 4 is an exploded elevational view of a laminating mold using release sheets of the present invention.

Turning finally to FIG. 4, a mold 45 is shown for forming laminate components. Mold 45 includes press platens 49, 51; metal caul plates 52, 53 and 54; kraft sheets 55 for texture formation or to assist in heat transfer; other laminate-making layers 56 used in laminate component production; and finally coated release sheet structure of the present invention 57, 58, 59 and 60 selectively interleaved among the laminate-making layers 56 and the press platens and caul plates 49, 51, 52, 53 and 54. Release sheet structures 57, 58, 59 and 60 are larger in area than the laminate-making layers 56 to prevent melting resin material 61 from migrating from one laminate-making layer 56 to another laminate-making layer 56.

EXAMPLE

A roll of 0.00092" thick Melinex 442 film having a width of 54" was passed through corona treatment station 13 to treat one side of the film. The film was then turned over and passed through the corona station a second time to treat the other side and then passed through coating station 23 and curing station 31 to cause a textured cured coating of Mobil No. 82XE087 resin material to be formed on one side of the film.

The coated film was turned over and a similar cured coating formed on the other side.

In the manufacture of laminates including printed circuit board (PCB's), laminated components are initially produced using molding techniques and thereafter such components together with further laminates are molded to form the final product. The mold release sheet structure of the present invention is useful in many laminate molding operations using press platens with or without caul plates.

The present invention includes the use of the mold release sheet as part of a laminate composite having, in addition, polyethylene film or paper. The laminate composite usually is composed of a two-part or three-part structure. In the two-part composite, the mold release sheet is laminated to the polyethylene or paper and in a three-part laminate the mold release sheet is laminated to the polyethylene or paper which is then laminated to another mold release sheet. In this three-part laminate, the polyethylene or paper is always between the two mold release sheets.

Figure 5:
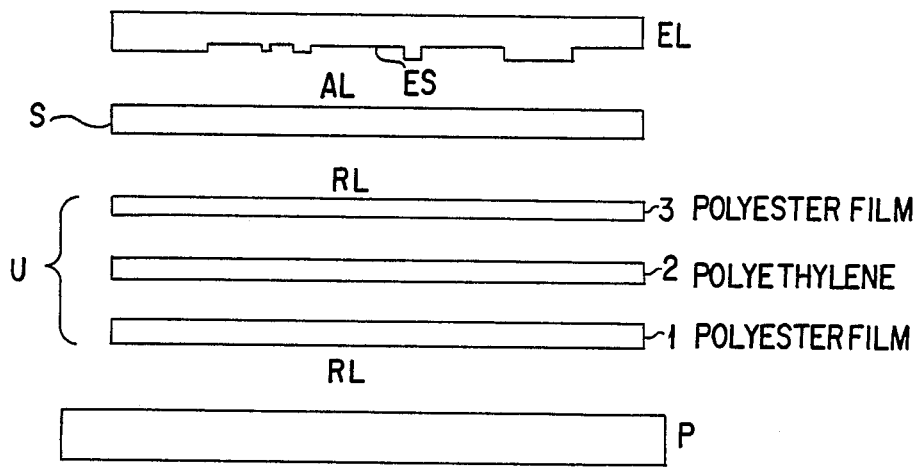

The function of the polyethylene sheet in the polyethylene laminate composite is to permit movement or contouring of appropriate components of multilayer laminates (the book) during the molding process. A mold release sheet/polyethylene/mold release sheet composite U (see FIG. 5) functions as follows to accomplish such an effect. The first mold release sheet (1), such as a release layer coated polyester sheet, engages platen P, and a second mold release sheet (3), which is typically of the same materials as sheet (1), engages a flexible coverlay sheet or laminate component S. Component S has an adhesive layer AL on one surface and this surface in turn engages etched board element EL having an irregular etched surface ES. When all the elements of the book (FIG. 5) are compressed together during molding, the mold release sheet/polyethylene/mold release sheet unit U forces flexible coverlay sheet S into the irregularities of etched surface ES aided by the hydraulic effect of polyethylene sheet (2) of unit U.

The polyethylene layer softens, melts and flows to create the hydraulic effect. The adhesive layer on flexible sheet S bonds to etched surface ES during the molding process. Mold temperatures of 330° F.–400° F., pressures from 100–700 psi, and press times of 20 minutes to two (2) hours are typical in the molding operation.

Figure 6:
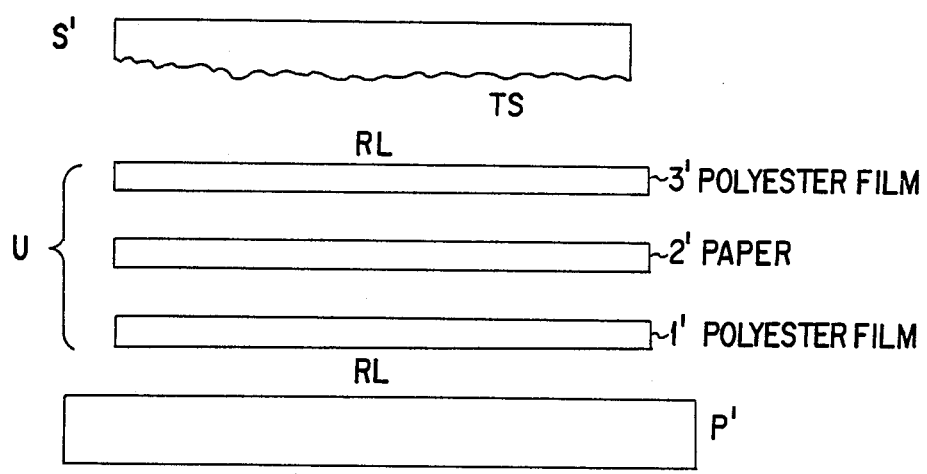

The function of the paper sheet in the paper laminate composite is to produce a texture or surface effect on a moldable laminate sheet. FIG. 6 shows a mold release sheet/paper/mold release sheet unit $U^1$ and, when urged against a moldable laminate sheet $S^1$ by platen $P^1$, will create a textured surface TS on sheet $S^1$ for the following reasons. Intermediate paper sheet $2^1$ varies in thickness and density due to the paper manufacturing techniques where paper fibers are deposited in a random and uneven manner. Additional variations in the paper are provided by the differences in density and size of deposited fibers. When pressure is exerted on the paper and other elements in FIG. 6 during the molding operation, the variations in the thickness and texture of sheet $2^1$ will be "transferred" through mold release sheet $3^1$ to sheet $S^1$ to create surface TS. Molding conditions with the paper laminate composite are similar to those with the polyethylene laminate composite, except that pressures may rise as high as 1200 psi.

With reference to FIGS. 5–10A, the following abbreviations are used:

| | |
|---|---|
| RL | application of a release layer |
| AL | application of an adhesive layer |
| Lam | laminate |
| CT | corona treat |
| U and $U^1$ | the "book" |
| P and $P^1$ | platen |
| S | flexible coverlayer sheet |
| EL | etched board element |
| ES | etched surface |
| $S^1$ | moldable laminate sheet or component |
| TS | textured surface |

For mold release sheet/polyethylene laminate composites, two methods of manufacture may be used. The first method consists of:

Step 1: Side 1 of a sheet of polyester film is corona treated;

Step 2: The sheet is turned over and side 2 of the film is corona treated and in a continuous manner is release coated and the coating cured on the second side; and Step 3: A sheet of polyethylene is corona treated and an adhesive applied to this same side, which side is then laminated to side 1 of the release coated polyester sheet (Step 2) and the adhesive is cured (see FIG. 7).

Figure 7:
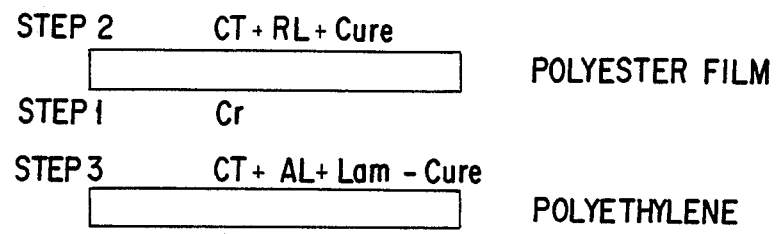
Figure 7A:
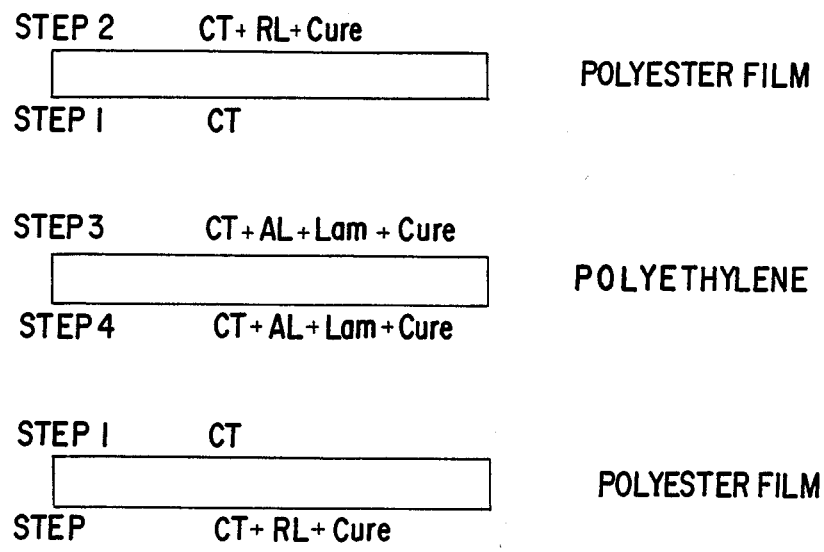

In a three-part laminate composite with polyethylene, the following step is added:

Step 4: The polyethylene surface of the laminate produced in Step 3 is corona treated and an adhesive applied to this surface, which surface is then laminated to side 1 of additional release coated polyester made in Step 2, and the adhesive is cured (see FIG. 7A).

The second, alternative method of manufacture consists of the following steps:

Step 1: Side 1 of a sheet of polyester film is corona treated;

Step 2: One side of a polyethylene sheet is corona treated and an adhesive applied to this same side, which side is laminated to side 1 of the polyester sheet (Step 1) and the adhesive is cured; and Step 3: The exposed side of the polyester sheet of the laminate produced in Step 2 is subsequently corona treated, coated with a release layer, and the release layer cured (see FIG. 8).

For three-part laminate structures with polyethylene, Step 3 is replaced with Step 3A and a Step 4 is added.

Figure 8:
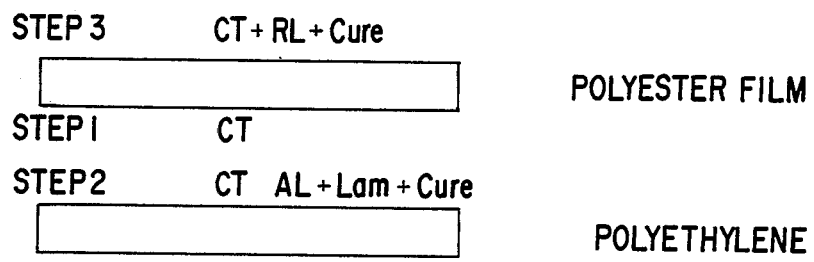
Figure 8A:
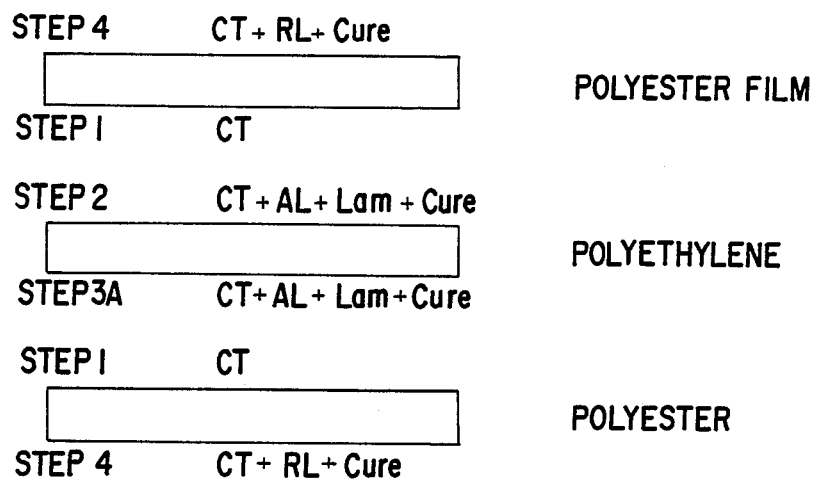

Step 3A: The exposed side of the polyethylene sheet of the laminate structure made in Step 2 is corona treated and an adhesive is applied to this same side, which side is then laminated to side 1 of more polyester film from Step 1; and Step 4: The exposed sides of both polyester films in the laminate structure produced in Step 3A are corona treated, coated with a release layer, and the release layers are cured (see FIG. 8A).

Composite laminates with polyethylene preferably employ the following:

Release Layer: Valspar 83XE007C release coating.
Curing Mode: Electron beam curing under nitrogen or other inert gas at a total dose of 3 megarads or greater.
Adhesive Layer: Sun Chemical GA79-5350 or Valspar 79E297. Both are acrylate oligomers with acrylate and other monomers as diluents.
Curing Mode: Electron beam curing through the polyester film layer at a dose of 3 megarads or greater.
Release Coating Weight: 1.5 to about 6 (more preferably to 4) pounds per three thousand (3000) square feet of film surface
Adhesive Weight: 1 to about 6 (more preferably 2½ to 3) pounds per three thousand (3000) square feet.
Adhesive Application: Offset gravure.
Polyethylene Film: Consolidated Thermoplasticls Product #330, or equivalent, 0.005-0.010 inch preferred.
Polyester Film: ICI America Melinex 442 or Melinex S.

In addition to polyester film as the release layer substrate, nylon film, cellulose acetate film, polyethersulphone, polyetherimide film and polyimide film may For mold release sheet/paper laminate composites, there are also two methods of manufacture. The first method consists of:

Step 1: Side 1 of a sheet of polyester film is corona treated:

Step 2: The sheet is turned over and side 2 of the film is corona treated and in a continuous manner is release coated and the coating cured on this second side; and Step 3: On side 1 of the release coated polyester film from Step 2, an adhesive layer is applied, cured to a pressure sensitive state, and laminated to a sheet of paper (see FIG. 9).

Figure 9:
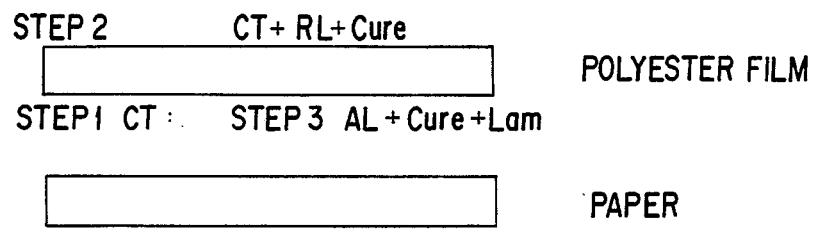
Figure 9A:
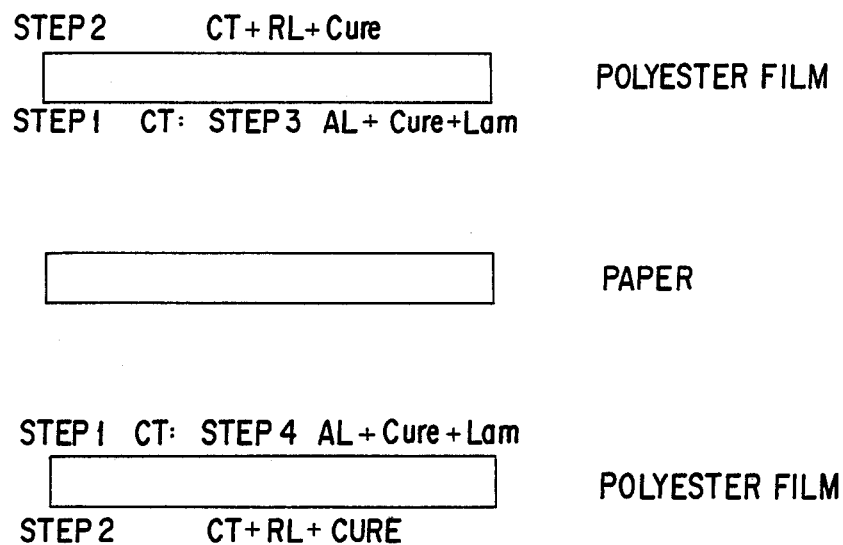

In instances where a three-part laminate composite with paper is desired, the following step is added:

Step 4: An additional sheet of release coated polyester film is obtained from Step 2 and on side 1 an adhesive layer is applied, cured to a pressure sensitive state and laminated to the exposed paper surface of laminate made in Step 3 above (see FIG. 9A).

The second, alternative method of manufacture is as follows:

Step 1: On one side of a polyester sheet, corona treat, apply an adhesive, cure the adhesive to a pressure sensitive state and laminate the adhesive to paper; and Step 2: The exposed side of the polyester sheet from the laminate in Step 1 is corona treated, coated with a release layer and the release layer cured (see FIG. 10).

For three-part laminate composites with paper, Step 2 is replaced by Step 2A and a Step 3 is added. The changes are:

Step 2A: On one side of a polyester sheet, corona treat, apply an adhesive, cure the adhesive to a pressure sensitive state, and laminate the adhesive to the paper side of the laminate produced in Step 1; and Step 3: The exposed sides of both polyester films in the laminate structure of Step 2A are corona treated, coated with a release layer and the release layer is cured (see FIG. 10A).

Composite laminates with paper preferably employ the following:

Release Layer: Valspar 83XE007C release coating.
Curing Mode: Electron beam curing under nitrogen or other inert gas at a total dose of 3 megarads or greater.
Adhesive Layer: Valspar 75X298B pressure sensitive adhesive.
Curing Mode: Electron beam curing under nitrogen or other inert gas at a dose of 1-3 megarads.
Release Coating Weight: 1.5 to about 6 (more preferably 3 to 4) pounds per three thousand (3000) square feet of film surface.
Adhesive Weight: 1 to about 6 (more preferably 2½-3) pounds per three.
Adhesive Application: Offset gravure.
Paper: Krafelt Co. WAT white, 0.004 inch thick paper; 0.004-0.010 inch preferred, but any gauge can be used.
Polyester: ICI America Melinex 442 or Melinex S are examples.

Films other than polyester and already described may also be employed.

We claim:

1. A mold release structure in medium to high pressure laminate molding at high temperature wherein said release sheet is intermediate to and in contact with pressed-together press plates, caul plates, kraft sheets, coverlay sheets and other laminate-making layers, the release sheet structure comprising
    a surface treated polyester, nylon or cellulose acetate film having two sides, such treatment of the flim promoting resin adhesion; and
    a first thin release layer of a cured release acrylated oligomer resin on at least one side of the film, said release resin being readily releasable from said laminate-making layers.

2. The mold release sheet structure of claim 1 having in addition to the first thin layer a second thin layer of the same resin on the other side of the film.

3. The mold release sheet structure of claim 1 in which the resin is an electron beam curable resin.

4. The mold release sheet structure of claim 1 in which the film is a polyester film comprising polyethylene terephthalate.

5. The mold release sheet structure of claim 1 in which the nylon film includes heat stabilized Type 66 nylon resin.

6. A laminate system including a release sheet structure in medium to high pressure laminate molding at high temperatures wherein said release sheet is intermediate to and in contact with pressed-together press plates, caul plates, kraft sheets, coverlay sheets and other laminate-making layers and mold components, such release sheet having, in combination, a sheet of thermally and dimensionally stable, smooth and high-tensile-strength coatable plastic polyster, nylon cellulose acetate, polyethersulfone, polyetherimide or polyimide substrate at least one surface of which has been treated to render the same receptive to an acrylated oligomer liquid resin coating material, a thin layer of such resin coating material applied to the treated surface and cured thereupon and thereto, said resin being readily releasable from such laimate-making layers and mold components.

7. A laminate system as claimed in claim 6 and in which said resin is of the electron-base-radiation curable type and is cured by said radiation.

8. A laminate system as claimed in claim 6 and in which the release sheet is of area larger than the laminates.

9. A mold release structure in medium to high pressure laminate molding at high temperatures wherein said release sheet is intermediate to and in contact with pressed-together press plates, caul plates, kraft sheets, coverlay sheets and other laminate-making layers, the release sheet structure comprising a surface treated polyester, polyethersulphone, polyetherimide, polyimide, nylon or cellulose acetate first sheet film having two (2) sides, such treatment of the sheet film promoting resin adhesion;

a first thin release layer of a cured release acrylated oligomer resin on one side of the first sheet film, said release resin being readily releasable from said laminate-making layers; and a polyethylene second sheet film adhered to the other side of the first sheet film.

10. The mold release sheet structure of claim 9 having a laminating adhesive between the polyethylene film and the sheet film which adhesive has been cured by electron beam radiation.

11. The mold release sheet structure of claim 9 in which the outside surface of the polyethylene film has adhered to it a second sheet film and in which a second sheet film carries a thin layer of such resin.

12. The mold release sheet structure of claim 9 in which the resin layer is electron beam curable.

13. The mold release sheet structure of claim 9 in which the first sheet film is a polyester film comprising polyethylene terephthalate.

14. A mold release structure in medium to high pressure laminate molding at high temperature wherein said release sheet is intermediate to and in contact with pressed-together press plates, caul plates, kraft sheets, coverlay sheets and other laminate-making layers, the release sheet structure comprising a surface treated polyster, polyethersulphone, polyetherimide, polyimide, nylon or cellulose acetate first sheet film having two (2) sides, such treatment of the sheet film promoting resin adhesion;

a first thin release layer resin of a cured release acrylated oligomer resin on one side of the first sheet film, said release resin being readily releasable from said laminate-making layers; and a second sheet film of paper adhered to the other side of the first sheet film.

15. The mold release sheet structure of claim 14 in which an outside surface of the paper sheet has adhered to it a second sheet film and in which a second sheet film carries a thin release layer of such resin.

16. The mold release sheet structure of claim 14 is electron beam curable.

17. The mold release sheet structure of claim 14 in which the film is a polyester film comprising polyethylene terephthalate.

* * * * *

UNITED STATES PATENT AND TRADEMARK OFFICE
CERTIFICATE OF CORRECTION

PATENT NO. : 4,753,847

DATED : June 28, 1988

INVENTOR(S) : Martin J. Wilheim and Edwin P. Tripp, III

It is certified that error appears in the above-identified patent and that said Letters Patent is hereby corrected as shown below:

Column 2, line 45, "510"F." should read --510°F.--.

Column 4, line 30, "340"-370"F." should read --340°-370°F.--.

Column 7, lines 28-29, "(more preferably to 4)" should read --(more preferably 3 to 4)--;

line 34, "Thermoplasticls" should read --Thermoplastics--;

line 40, "film may" should read --film may be used.--.

Column 8, line 37, "temperature" should read --temperatures--;

line 43, "flim" should read --film--.

Column 9, line 7, "laimate" should read --laminate--;

line 10, "base" should read --beam--;

line 11, "said" should read --such--.

UNITED STATES PATENT AND TRADEMARK OFFICE
CERTIFICATE OF CORRECTION

PATENT NO. : 4,753,847

DATED : June 28, 1988

INVENTOR(S) : Martin J. Wilheim and Edwin P. Tripp, III

It is certified that error appears in the above-identified patent and that said Letters Patent is hereby corrected as shown below:

Column 10, line 11, "temperature" should read --temperatures--.

Signed and Sealed this

Seventh Day of March, 1989

Attest:

DONALD J. QUIGG

*Attesting Officer*  *Commissioner of Patents and Trademarks*